(12) United States Patent
Naito et al.

(10) Patent No.: US 9,270,042 B2
(45) Date of Patent: Feb. 23, 2016

(54) CARD CONNECTOR

(75) Inventors: Yuji Naito, Yamato (JP); Mitsuhiro Tomita, Yamato (JP); Hideo Nagasawa, Naka-gun (JP)

(73) Assignee: Molex, LLC, Lisle, IL (US)

( * ) Notice: Subject to any disclaimer, the term of this patent is extended or adjusted under 35 U.S.C. 154(b) by 0 days.

(21) Appl. No.: 13/885,193

(22) PCT Filed: Nov. 29, 2011

(86) PCT No.: PCT/US2011/062404
§ 371 (c)(1),
(2), (4) Date: Jul. 24, 2013

(87) PCT Pub. No.: WO2012/075014
PCT Pub. Date: Jun. 7, 2012

(65) Prior Publication Data
US 2014/0148046 A1 May 29, 2014

(30) Foreign Application Priority Data
Nov. 29, 2010 (JP) ................. 2010-264924

(51) Int. Cl.
| H01R 24/00 | (2011.01) |
| H01R 12/72 | (2011.01) |
| H01R 13/629 | (2006.01) |
| H05K 7/20 | (2006.01) |
| G06K 7/00 | (2006.01) |
| G06K 13/08 | (2006.01) |

(52) U.S. Cl.
CPC ............ H01R 12/721 (2013.01); G06K 7/0021 (2013.01); H01R 13/629 (2013.01); H05K 7/2049 (2013.01); G06K 13/0806 (2013.01)

(58) Field of Classification Search
CPC .............................. H01R 27/00; G06K 7/0021
USPC ............ 439/31, 33, 489, 485, 487, 465, 467, 439/633, 634, 630
See application file for complete search history.

(56) References Cited

U.S. PATENT DOCUMENTS

| 5,967,845 | A | 10/1999 | Ho et al. |
| 6,623,304 | B2 | 9/2003 | Harasawa et al. |
| 7,335,064 | B2 | 2/2008 | Matsukawa et al. |
| 7,500,879 | B2 * | 3/2009 | Ting et al. ...................... 439/630 |
| 8,167,643 | B2 * | 5/2012 | Yoshida ............... G06K 7/0047 439/485 |
| 8,547,703 | B2 * | 10/2013 | Aoki ................... H01L 23/4093 174/252 |

FOREIGN PATENT DOCUMENTS

| CN | 201540993 U | 8/2010 |
| JP | 06-038180 U | 5/1994 |
| JP | 2009-146701 A | 7/2009 |
| JP | 2010-015723 | 1/2010 |
| JP | 2010-114100 | 5/2010 |
| JP | 2010-218955 | 9/2010 |

OTHER PUBLICATIONS

International Search Report for PCT/US2011/062404.

* cited by examiner

*Primary Examiner* — Abdullah Riyami
*Assistant Examiner* — Thang Nguyen
(74) *Attorney, Agent, or Firm* — James A. O'Malley

(57) ABSTRACT

A card connector includes a housing that houses a card provided with a terminal member, a connecting terminal and a cover member. The connecting member is attached to the housing that connects with the terminal member of the card. The cover member is connected to the housing and forms a card housing space between the housing, and is attached to a substrate.

15 Claims, 11 Drawing Sheets

(a)

(b)

CARD CONNECTOR

REFERENCE TO RELATED APPLICATIONS

The Present Disclosure claims priority to prior-filed Japanese Patent Application No. 2010-264924, entitled "Card Connector," filed on 29 Nov. 2010 with the Japanese Patent Office. The content of this patent application is fully incorporated in its entirety herein.

BACKGROUND OF THE PRESENT DISCLOSURE

The Present Disclosure relates, generally, to a card connector, and more particularly, to a card connector that can rapidly remove the heat generated by the card with a simple construction, a small size, easy manufacturing and low cost. Additionally, the card connector should be able to securely hold the card with a simple construction, a small size, easy manufacturing, low cost and excellent reliability.

Conventional electronic devices are generally provided with a card connector in order to use various memory cards. Further, conventional card connectors generally have a push/push structure from a perspective of easy handling, so as to press-in a memory card to insert and remove the card. An example is illustrated at Japanese Patent Application No. 2009-146701, the content of which is fully incorporated in its entirety herein.

FIG. 11 illustrates a conventional card connector, in which 811 is a housing for a card connector composed of an insulating material, and is provided with a plurality of connecting terminals 851 composed of metal. Further, 861 is a card connector shell composed of a metallic sheet, and which is mounted on the upper side of the housing 811. Furthermore, a memory card 901 is inserted between the shell 861 and the housing 811, and contacts the connecting terminal 851 that corresponds to a contact pad 951 of the memory card 901.

In the example illustrated, the card connector is of a push/push type which has a guide mechanism to eject the memory card 901. The guide mechanism is provided with a slide member 821 engaged with the memory card 901 such that it slides with the memory card 901, and also a coil spring 881 that biases the slide member 821 in the direction of ejecting the memory card 901.

Moreover, a cam groove of the heart cam mechanism is formed on the upper surface of the slide member 821, and one end of a pin member 871 of the heart cam mechanism is engaged with the cam groove. In addition, the pin member 871 is held by being biased downward from the top by a leaf spring 865 of the shell 861. Further, the slide member 821 is provided with a lever 822, where an engaging part 823 is engaged with an engaging recess part 912 of the memory card 901.

When the memory card 901 is pushed into the housing 811, the memory card 901 is pressed in the inward direction (upper right direction in the drawing) of the housing 811. Subsequently, the engaging recess part 912 of the memory card 901 is engaged with the engaging part 823 of the lever 822 of the slide member 821, and the slide member 821 resists the repulsive force of the coil spring 881 and moves in the inward direction of the housing 811 with the memory card 901. Then, when the slide member 821 stops due to one end of the pin member 871 being latched to the cam groove of the heart cam mechanism by an operation of the heart cam mechanism, the memory card 901 also stops in an inserted state within the housing 811.

When the memory card 901 is removed from the housing 811, the state where one end of the pin member 871 is latched to the cam groove of the heart cam mechanism is released by being pushed. Accordingly, the slide member 821 is freed and moves in the near side direction (left lower direction in the drawing) with the memory card 901 due to the force exhibited by the coil spring 881 so that the memory card 901 is ejected from the housing 811.

However, strategies for heat dissipation have not been sufficiently implemented in conventional card connectors. In recent years, in conjunction with smaller electronic devices with higher performance, efforts have been made to reduce the size of the memory card 901 together with increasing the capacity of the memory card 901 and increasing the speed of the transfer rate for the input and output of data by the memory card 901. Therefore, because the component mounting density has increased within electronic devices thereby reducing open spaces, regardless of the increase in heat generated by the memory card 901, ventilation conditions around the card connector have worsened, thereby reducing the ability for heat dissipation and thus the temperature of the memory card 901 increases. Accordingly, although the temperature increase can be prevented in the memory card 901 by arranging a cooling device, such would require increasing the size of the electronic device as well as the cost.

SUMMARY OF THE PRESENT DISCLOSURE

An object of the Present Disclosure is to provide a highly reliable card connector that can solve the problems in conventional card connectors, rapidly remove the heat generated by the card with a simple construction, a small size, easy manufacturing and low cost. Additionally, the card connector should be able to securely hold the card with a simple construction, a small size, easy manufacturing, low cost and excellent reliability.

Therefore, the card connector of the Present Disclosure includes a housing that houses a card provided with a terminal member, a connecting terminal attached to the housing that connects with the terminal member of the card, and a cover member connected to the housing and which forms a card housing space between the housing, which is attached to a substrate. The cover member may include a top panel part, a plurality of side panel parts established from the edge of the top panel part, anchoring tabs that extend from the bottom edge of the side panel part, and a heat transfer enhancing member connected to the bottom edge of the side panel part. At least one of the anchoring tabs may be connected to a pad arranged on the substrate. Finally, the heat transfer enhancing member may upwardly bias the lower surface of the card housed within the card housing space, and heat transfer may be enhanced to the pad through the cover member from the card by pressing the top surface of the card on the top panel part.

In addition, in another card connector of the Present Disclosure, the card provides a heat dissipation pad arranged on the bottom surface thereof. Further, the heat transfer enhancing member connects to the heat dissipation pad.

In addition, the heat transfer enhancing member provides a base part connected to the pad. Further, a supporting arm tab extending from the base part. Further, the tip end of the supporting arm tab abuts the heat dissipation pad.

In addition, the terminal member is arranged on the bottom surface on the front end side half portion on the card, and is upwardly biased by the connection terminal. Further, the heat dissipation pad is arranged on the bottom surface on the rear end side half portion on the card, and is also upwardly biased by the heat transfer enhancing member.

In addition, the heat dissipation pad includes a second heat dissipation pad arranged on the bottom surface of the front end side half portion on the card. Further, the heat transfer enhancing member includes a second heat transfer enhancing member that abuts the second heat dissipation pad.

Finally, the second heat transfer enhancing member provides a main body part attached to the housing, an arm part that extends from the front end of the main body part, a connecting part that connects to the tip end of the arm part, and a tail part that extends from the rear end of the main body part. Further, the connecting part abuts the second heat dissipation pad, and the tail part is connected to the pad.

BRIEF DESCRIPTION OF THE FIGURES

The organization and manner of the structure and operation of the Present Disclosure, together with further objects and advantages thereof, may best be understood by reference to the following Detailed Description, taken in connection with the accompanying Figures, wherein like reference numerals identify like elements, and in which.

DESCRIPTION OF THE PREFERRED EMBODIMENTS

While the Present Disclosure may be susceptible to embodiment in different forms, there is shown in the Figures, and will be described herein in detail, specific embodiments, with the understanding that the disclosure is to be considered an exemplification of the principles of the Present Disclosure, and is not intended to limit the Present Disclosure to that as illustrated.

In the embodiments illustrated in the Figures, representations of directions such as up, down, left, right, front and rear, used for explaining the structure and movement of the various elements of the Present Disclosure, are not absolute, but relative. These representations are appropriate when the elements are in the position shown in the Figures. If the description of the position of the elements changes, however, these representations are to be changed accordingly.

Referring to FIGS. 1-4, 1 is a card connector according to the present embodiment, is surface mounted to attach to a substrate 91 such as a printed circuit board, flexible printed circuit board (FPC) or the like provided by an electronic device (not illustrated). The card 101 is inserted into the card connector, and loaded into the electronic device therethrough.

Figure 4:
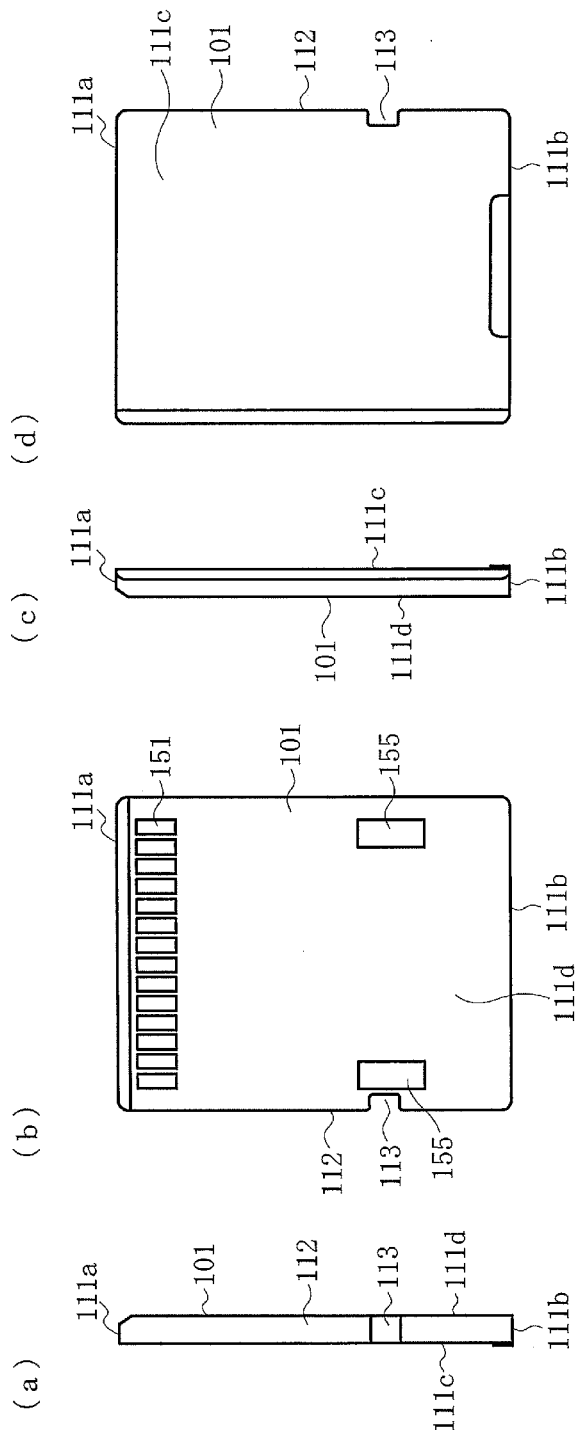
FIG. 4 is four orthogonal views of a card inserted in the card connector of FIG. 1, where (a) is a right side surface view, (b) is a bottom surface view, (c) is a left side surface view and (d) is a top surface view.

In the present embodiment, the card 101 has a nearly rectangular shape overall, as illustrated in FIG. 4, and a contact pad 151 is arranged as a plurality of terminal members so as to be in line along a front end 111a on the bottom surface 111d near the front end 111a. In addition, heat dissipation pads 155 are arranged as a pair of heat dissipation members to the bottom surface 111d of the portion near the rear end 111b. Moreover, the contact pad 151, as well as the heat dissipation pads 155, are not arranged on the top surface 111c. Further, at least one recessed part 113 is formed in the latter portion (a part that is nearer to the rear end 111b than the middle point between the front end 111a and the rear end 111b) in at least one side of the side edges 112 that joins the front end 111a with the rear end 111b. Here, for convenience of description, a description will be given of an example where only one recessed part 113 is formed in the latter part in the right side edge 112.

Preferably, the card connector 1 is provided with a housing 11 formed integrally and composed of an insulating material, terminals 51 as a plurality of connecting terminals attached to the housing 11, and formed integrally by stamping a plate material composed of insulating material and undergoing a process for folding or the like, and a shell 61 as the cover member attached to the upper side of the housing 11, formed integrally by stamping a plate material composed of insulating material and undergoing a process for folding or the like.

The shell 61 covers the housing 11 and the upper side of at least one part of the card 101 housed in the housing 11. The card connector 1 is a roughly flat rectangular parallelepiped shape that attaches to the electronic device. The card 101 is inserted into the card housing space formed between the housing 11 and the shell 61 from the front side (lower left side in FIG. 1 (a), and upper right side in FIG. 3 (b)). In addition, the terminals 51 are typically integrated with the housing 11 by overmolding. In other words, the housing 11 is formed by filling resin in the cavity of a mold prepared inside in advance.

As shown in the Figures, the housing 11 includes a bottom wall part 11b with a nearly rectangular plate-like form, and a back wall part 11a installed from the bottom wall part 11b, and extends along the edge of the back side (left upper side in FIG. 2) in the back part of the bottom wall part 11b. Here, the bottom wall part 11b is provided with a terminal retention part 11d where the terminals 51 are attached as the connecting terminal to the top surface. The terminals 51 may be integrated with the terminal retention part 11d by overmolding. However, a plurality of terminal load grooves may be formed on the top side of the terminal retention part 11d so as to extend in the front-back direction (w connects the upper left and lower right in FIG. 2), and the terminals 51 may be inserted and attached in each terminal loading groove.

The terminals 51 are elongated strip-shaped members extending parallel to each other in the front-back direction, and arranged in parallel so as not to contact each other between adjacent terminals. Each terminal 51 includes a body 51*a* extending in the front-back direction, an arm part 51*d* extending forward from the front end of the body 51*a*, a contact part 51*b* connecting to the tip of the arm part 51*d*, and a tail part 51*c* as the solder tail part extending backward from the back end of the body 51*a*.

Also, for the terminal 51, the main body part 51*a* is attached to the terminal retention part 11*d*, the arm part 51*d* extends diagonally upward towards the back wall part 11*a*, and the contact part 51*b* connected to the tip of the arm part 51*d* protrudes upward from the top surface of the bottom wall part 11*b*. The contact part 51*b* of each terminal 51 is electrically connected by contacting the contact pad 151 that corresponds to the bottom surface 111*d* of the card 101.

Further, the tail part 51*c* protrudes towards the front side (from the lower left to the upper right direction in FIG. 1) from the edge of the front side of the bottom wall part 11*b*, and is electrically connected to a terminal connection pad 92 as a counter-terminal member formed on the surface of the substrate 91 by soldering or the like. Moreover, the terminal connection pad 92 is connected to the surface of the substrate 91 or to signal wires or the like formed internally.

The arm part 51*d* functions as the cantilever leaf spring member to bias contact part 51*b* elastically upward. Therefore, the contact part 51*b* is suppressed by the contact pad 151 of the card 101, so contact between the contact part 51*b* and the contact pad 151 is securely maintained.

Furthermore, an opening 11*c* that passes through across the thickness of the bottom wall part 11*b* is formed in a part that corresponds to the lower side of the arm part 51*d* and the contact part 51*b* in the bottom wall part 11*b*. In addition, the opening 11*c* can be omitted as necessary.

Figure 1:
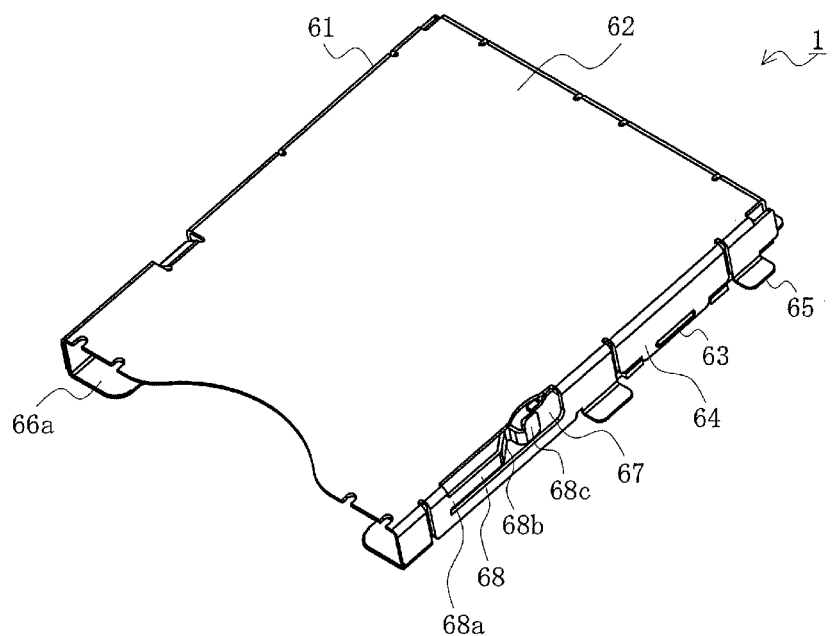
FIG. 1 is a perspective view of a card connector according to the first embodiment of the Present Disclosure, where (a) is a diagonal view from above and (b) is from below.
Figure 1:
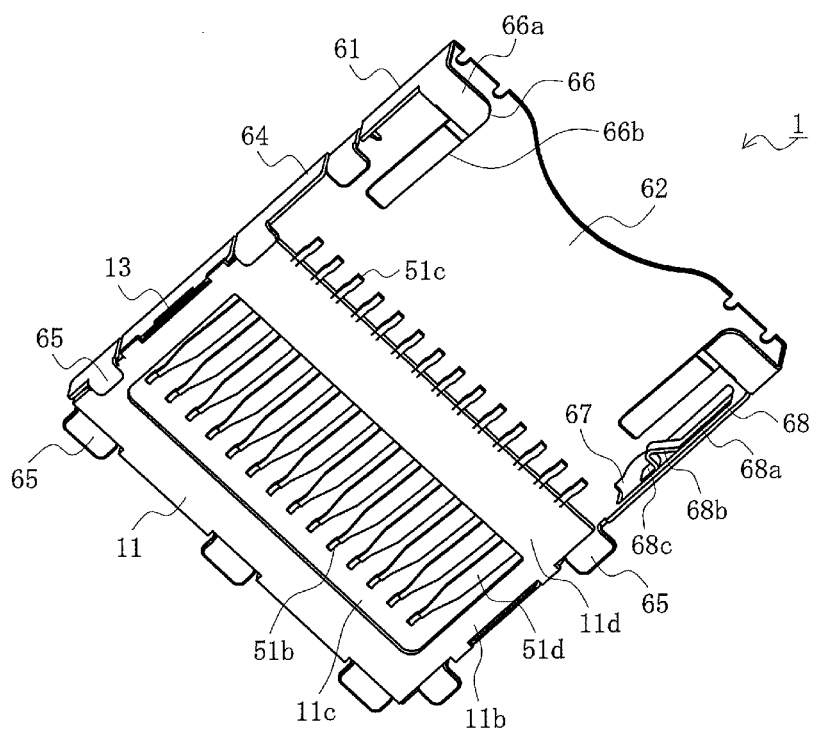
Figure 2:
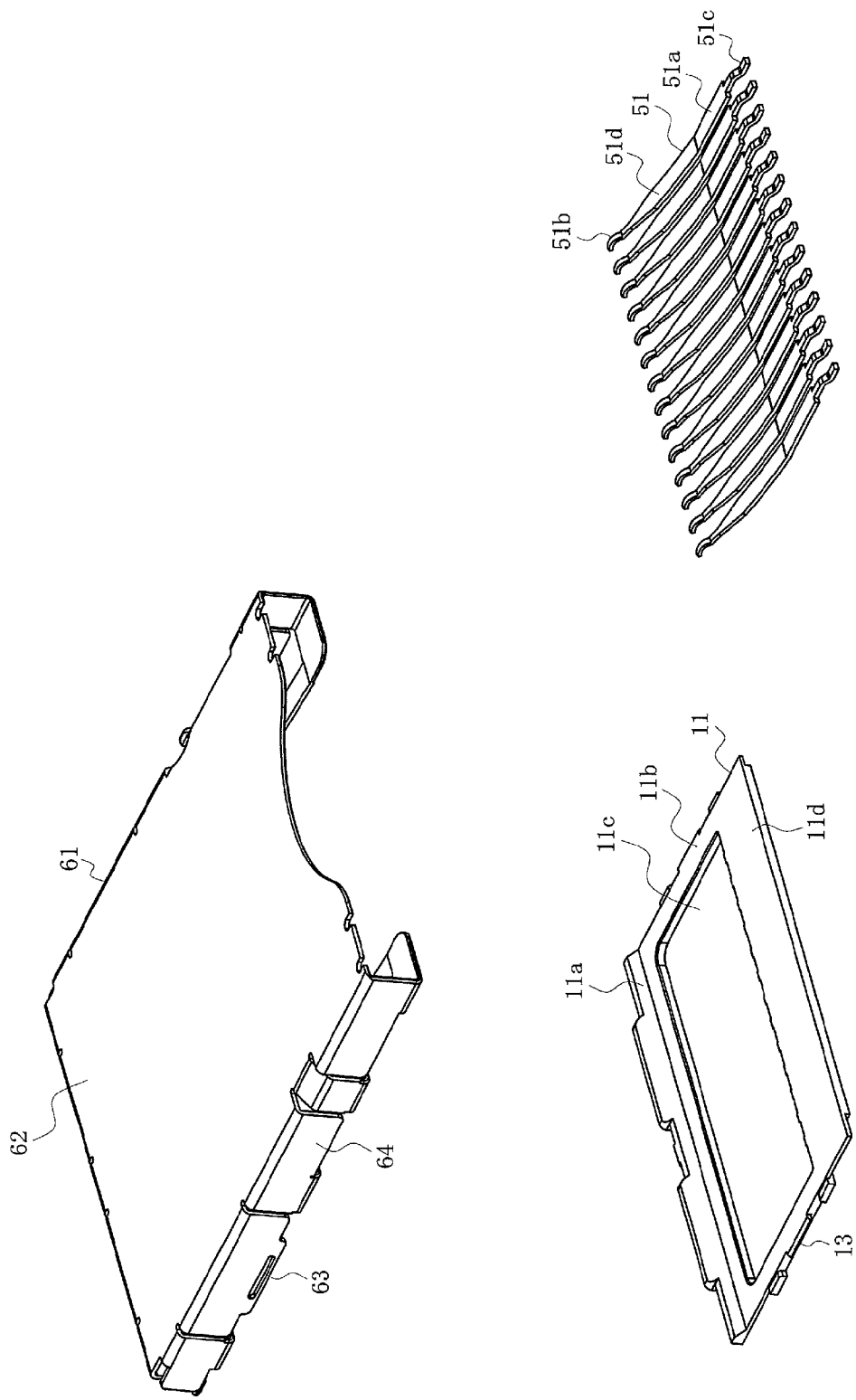
FIG. 2 is an exploded view of the card connector of FIG. 1.
Figure 3:
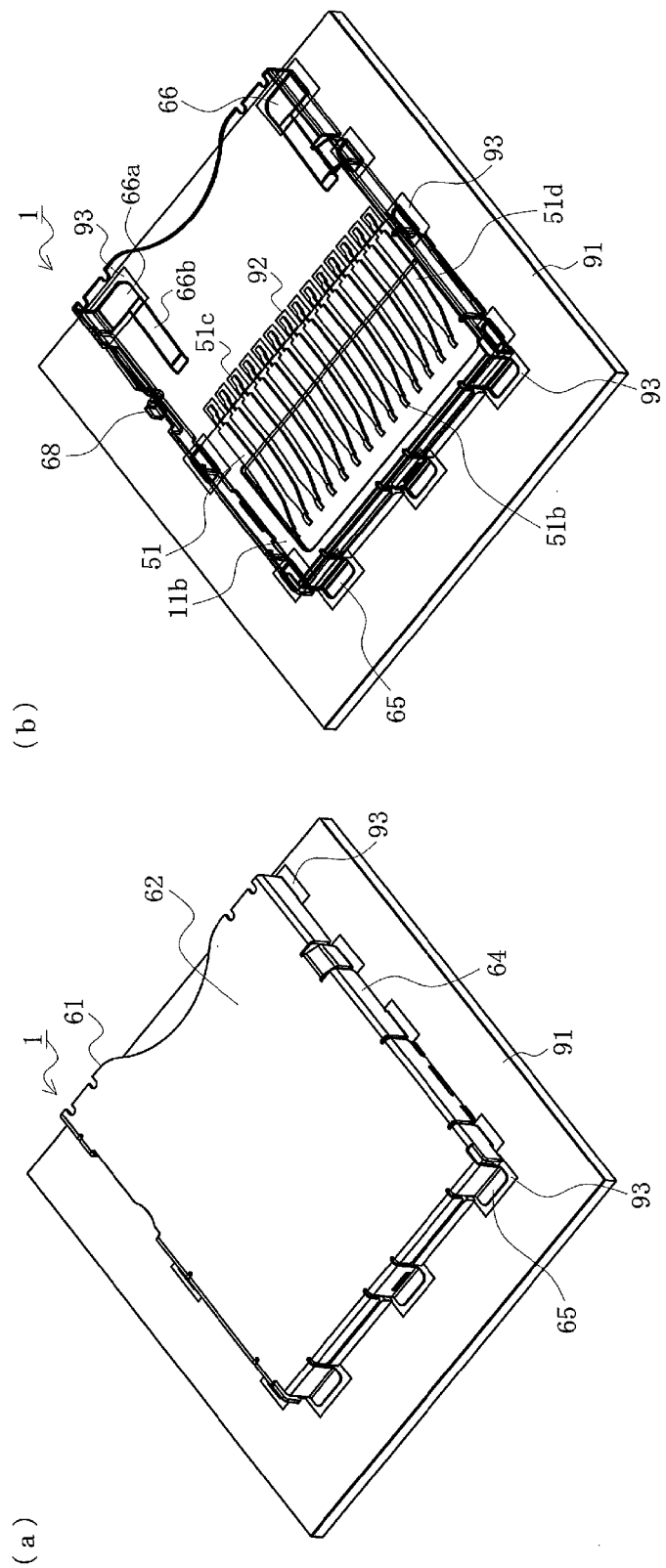
FIG. 3 is a perspective view illustrating a state in which the card connector of FIG. 1 is mounted on a substrate, where (a) is a diagonal view from the above back side and (b) is a perspective plan view of (a)

Further, the shell 61 includes a top panel part 62 in a roughly rectangular shape, and a plurality of side panel parts 64 installed from side edges in a plurality of locations (more specifically, both side edges and the back side edge) of the top panel part 62. A plurality of latch openings 63 are formed on the side panel parts 64, as illustrated in FIG. 1. When the shell 61 is attached to the upper side, the latch opening 63 is latched to the latching projection 13 formed on the outer surface of the bottom wall part 11*b* so that the shell 61 is fixed to the housing 11.

Also, a plurality of anchoring tabs 65 extend from the lower edge of the side panel part 64 in a parallel direction with the top panel part 62. At least one of the anchoring tabs 65 is anchored to the anchoring pad 93 as a pad arranged on the surface of the substrate 91. It is preferred that all anchoring tabs 65 are anchored by being connected to the anchoring pad 93.

The anchoring pad 93 is connected to the undersurface of the substrate 91 or to a ground wire or the like formed internally. Herein, the ground wire of the substrate 91 is, for example, a plate-like member with a wide width made of metal with high heat conductivity, and it is preferable to be a member that functions as a heat radiating plate or a heat conducting plate. By so doing, the heat generated by the card 101 can be transferred to the ground wire through the top panel part 62, side panel part 64, anchoring tab 65 and anchoring pad 93, and is efficiently dissipated. In this case, the anchoring pad 93 functions as a heat transfer pad. In addition, the anchoring pad 93 is not a ground wire that only serves as a heat radiator or heat conductor, but a ground line that may be connected to a heat radiating or conducting plate.

Further, some of the anchoring tabs 65 extend outward of the shell 61, and other anchoring tabs 65 extend inward of the shell 61. The anchoring tabs 65 extending inward of the shell 61 abut the bottom surface of the bottom wall part 11*b* of the housing 11 to demonstrate the function for anchoring the shell 61 to the housing 11.

In addition, the top panel part 62 of the shell 61 is typically bigger than the bottom wall part 11*b* of the housing 11 and nearly the same size as the upper surface 111*c* of the card 101. In the example illustrated, the top panel part 62 has approximately twice the area of the bottom wall part 11*b*. Also, the shell 61 is installed on the upper side of the housing 11 so that the side panel part 64 installed from the back side edge of the top panel part 62 abuts the outer surface of the back wall part 11*a*. In other words, the back side edge of the top panel part 62 and the back side edge of the bottom wall part 11*b* nearly match. Accordingly, the configuration is such that there is no housing 11 at the lower side portion of about the front half of the top panel part 62.

A card retention tab 66 is also connected as a heat transfer enhancing member to the side panel part 64 in the front edge of the shell 61. A base part 66*a* of the card retention tab a66 extends from the lower edge of the side panel part 64 inward of the shell 61 parallel to the top panel part 62, and a supporting arm tab 66*b* extends from the front edge side of the base part 66*a* towards the back wall side. The supporting arm tab 66*b* is a cantilever leaf spring member with elasticity, and extends diagonally upward toward the back wall side. In addition, the base part 66*a*, similar to the anchoring tab 65, can be anchored and connected to the anchoring pad 93 formed on the surface of the substrate 91, or it can be made to abut without anchoring.

In addition, the tip of the supporting arm tab 66*b* contacts the heat dissipation pad 155 of the bottom surface 111*d* of the card 101. In this case, the supporting arm tab 66*b* functions as a cantilever leaf spring member to bias the tip thereof elastically upward. Therefore, the tip of the supporting arm tab 66*b* is suppressed by the heat dissipation pad 155 of the card 101, so contact with the heat dissipation pad 155 can be securely maintained.

By so doing, the heat generated by the card 101 can be transferred from the heat dissipation pad to the ground wire through the supporting arm tab 66*b*, the base part 66*a*, and the anchoring pad 93 and is efficiently dissipated. Further, because the tip of the supporting arm tab 66*b* is biased elastically upward to support the bottom surface 111*d* of the card 101 inserted into the card housing space between the housing 11 and the shell 61, the top surface 111*c* of the card 101 is pressed to the top panel part 62 of the shell 61, thereby stabilizing the disposition of the card 101 within the card housing space. Furthermore, the heat generated by the card 101 is efficiently transferred because the entire top surface 111*c* of the card 101 abuts the top panel part 62 of the shell 61. Moreover, the heat is transferred to the ground wire through the side panel part 64, the anchoring tab 65 and the anchoring pad 93 to the efficiently dissipate.

Additionally, a shell 61 provides at least one locking member 68 formed on at least one side of the side panel part 64 of the left and right sides. Here, for the convenience in describing, a description will be given only for an example where only one locking member 68 is formed on the right side panel 64. The locking member 68 is provided with a locking main body 68*a* that is a cantilever plate spring member formed by cutting and bending a part of the side panel part 64, and its base edge part is integrally connected to the side panel part 64 and extends toward the back wall part 11a side (in the inserting direction of the card 101); a locking ridged part 68b formed by bending so as to protrude toward the inside of the shell 61 and is connected to the tip of the locking main body 68a; and a plate-shaped operating part 68c that is connected to the tip of the locking ridged part 68b. The operating part 68c is preferably formed so as to be almost flush with the locking main body 68a. Accordingly, because the operating part 68c does not protrude from the side surface of the card connector, size reduction is possible without increasing the width of the card connector 1, and the processing of the locking member 68 is even easier. In addition, the periphery of the locking member 68 is made of the opening 67 where a portion of the shell 61 is removed. Also, the locking member 68 is elastically displaced in an orthogonal direction to the side panel part 64.

Accordingly, the locking ridged part 68b of the locking member 68 is engaged by fitting into the recessed part formed in the side edge 112 of the card 101 that is inserted in the card housing space between the housing 11 and shell 61. Therefore, the card 101 can be securely locked and held.

Figure 5:
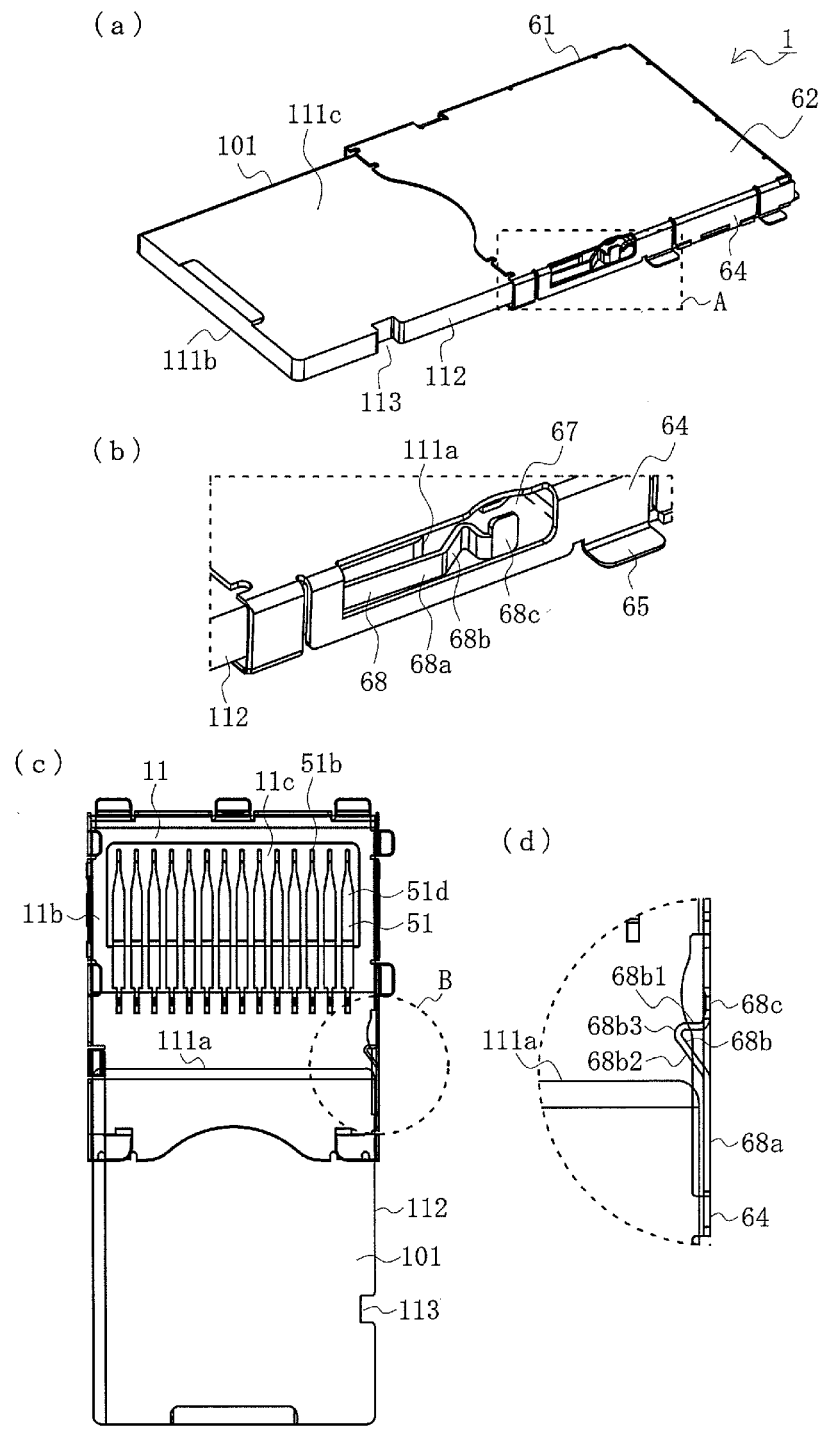
FIG. 5 is a set of drawings illustrating a midway state of inserting the card into the card connector of FIG. 1, where (a) is a perspective view, (b) is an enlarged view of the A part in (a), (c) is a perspective plan view and (d) is an enlarged view of the B part in (c)
Figure 6:
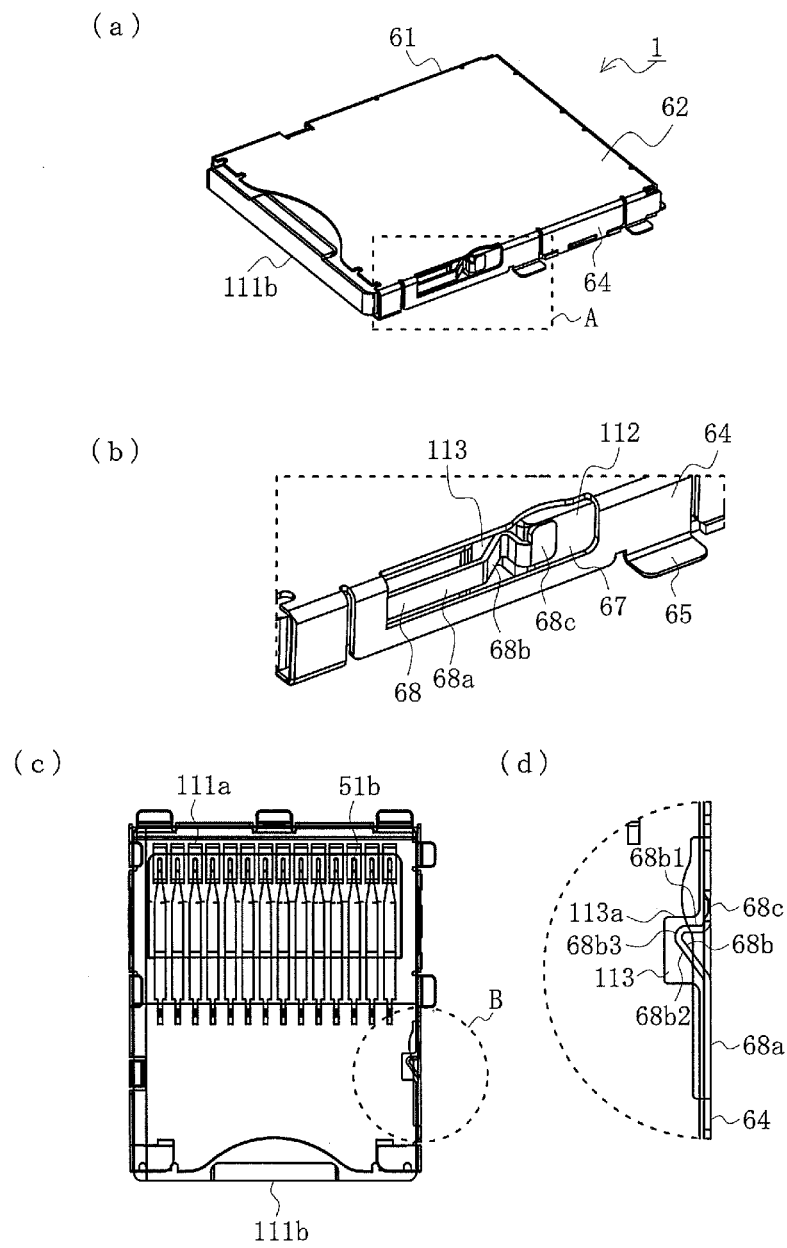
FIG. 6 is a set of views illustrating the state in which the card inserted into the card connector of FIG. 1 is locked, where (a) is a perspective view, (b) is an enlarged view of the A part in (a), (c) is a perspective plan view and (d) is an enlarged view of the B part in (c)

Referring generally to FIGS. 5-8, and specifically as illustrated in (d) in FIGS. 5-6, the locking ridged part 68b of the locking member 68 formed in the shell 61 is provided with a locking part 68b1 nearly orthogonal to the locking main body 68a, and the surface of the operating part 68c and a sloping part 68b2 extending in the sloping direction toward the surface. The shape viewed from above is nearly a right triangle. In the right triangle, the ridged vertex part 68b3 positioned between the side corresponding to the locking part 68b1 and the side corresponding to the sloping part 68b2, is an acute angle, and the vertex positioned between the side opposing the ridged vertex part 68b3 and the side corresponding to the locking part 68b1 is nearly at a right angle. In addition, in the initial state where the card 101 is not yet inserted, the locking main body 68a and the surface of the operating part 68c are almost flush with the side panel part 64 of the periphery.

To begin with, the card 101 is inserted into the card housing space formed between the housing 11 and the shell 61 from the front side (lower left side in FIG. 5 (a)) of the card connector 1. In addition, the card 101 is inserted in the position so that the bottom surface 111d on which the contact pad 151 is arranged opposes the bottom wall part 11b of the housing 11, the top surface 111c on which the contact pad 151 is not arranged opposes the top panel part 62 of the shell 61, and the front end 111a faces toward the back wall part 11a. Thereby, the card 101 proceeds along the side edge 112 where the recessed part 113 is formed. In other words, along the right side edge 112 there is the side panel part 64 where the locking member 68 is formed in the shell 61, while along the other side edge 112, that is the left side edge 112, there is the side panel part 64 where the locking member is not formed in the shell 61.

In short, the card 101 proceeds in the manner where both left and right side edges are guided by the side panel part 64 on both the left and right sides in the shell 61. In addition, FIG. 5 illustrates the initial stage in the inserting process of the card 101, and it illustrates the state where only the front end 111a and its proximity are inserted into the card housing space, and it illustrates the state when the front end 111a reaches the near side of the locking ridged part 68b of the locking member 68.

Subsequently, when the card 101 is pushed further in from that illustrated in FIG. 5, the right side edge 112 of the card 101 abuts the locking ridged part 68b of the locking member 68, and the locking member 68 displaces to the outside direction (right direction in FIGS. 5(c) and (d)) of the shell 61.

When the right side edge 112 of the card 101 abuts the locking ridged part 68b of the locking member 68, the locking member 68 can be smoothly displaced to the outside direction of the shell 61 due to abutting the sloping part 68b2 first. Accordingly, the card 101 can proceed without receiving much resistance from the locking member 68, and can easily be pushed in.

Furthermore, the locking ridged part 68b is placed farther rearward in the area where the locking main body 68a connected to the side panel part 64 in regards to the proceeding direction of the card 101. In other words, the locking ridged part 68b is placed in the trailing side of the locking member 68 that is the cantilever leaf spring member. Therefore, the card 101 can displace the locking ridged part 68b to the outside direction of the shell 61 without receiving much resistance. Accordingly, the card 101 can proceed extremely smoothly, and can easily be pushed in. Further, the front end 111a of the card 101 either abuts or draws near the back wall part 11a of the housing 11 as well as the side panel part 64 of the back side of the shell 61 to be in the state illustrated in FIG. 6; and thus completing the insertion of the card 101.

Figure 7:
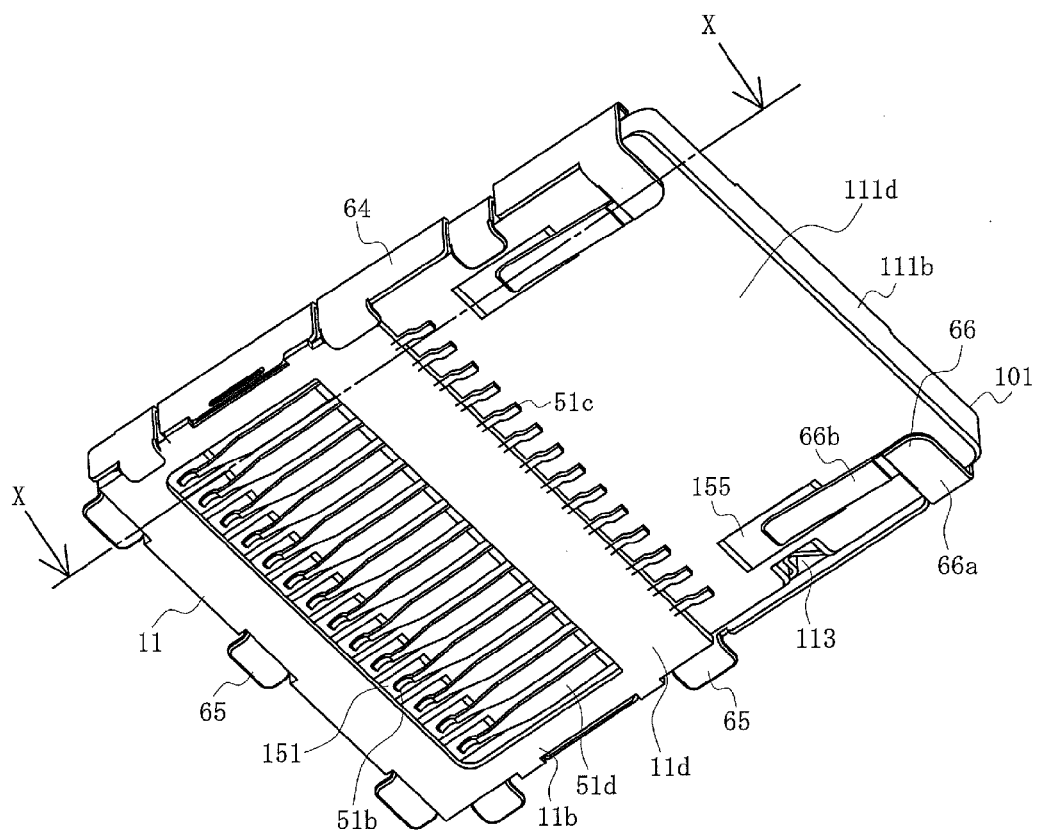
FIG. 7 is a perspective view illustrating a state in which the card inserted into the card connector of FIG. 1 is locked.
Figure 8:
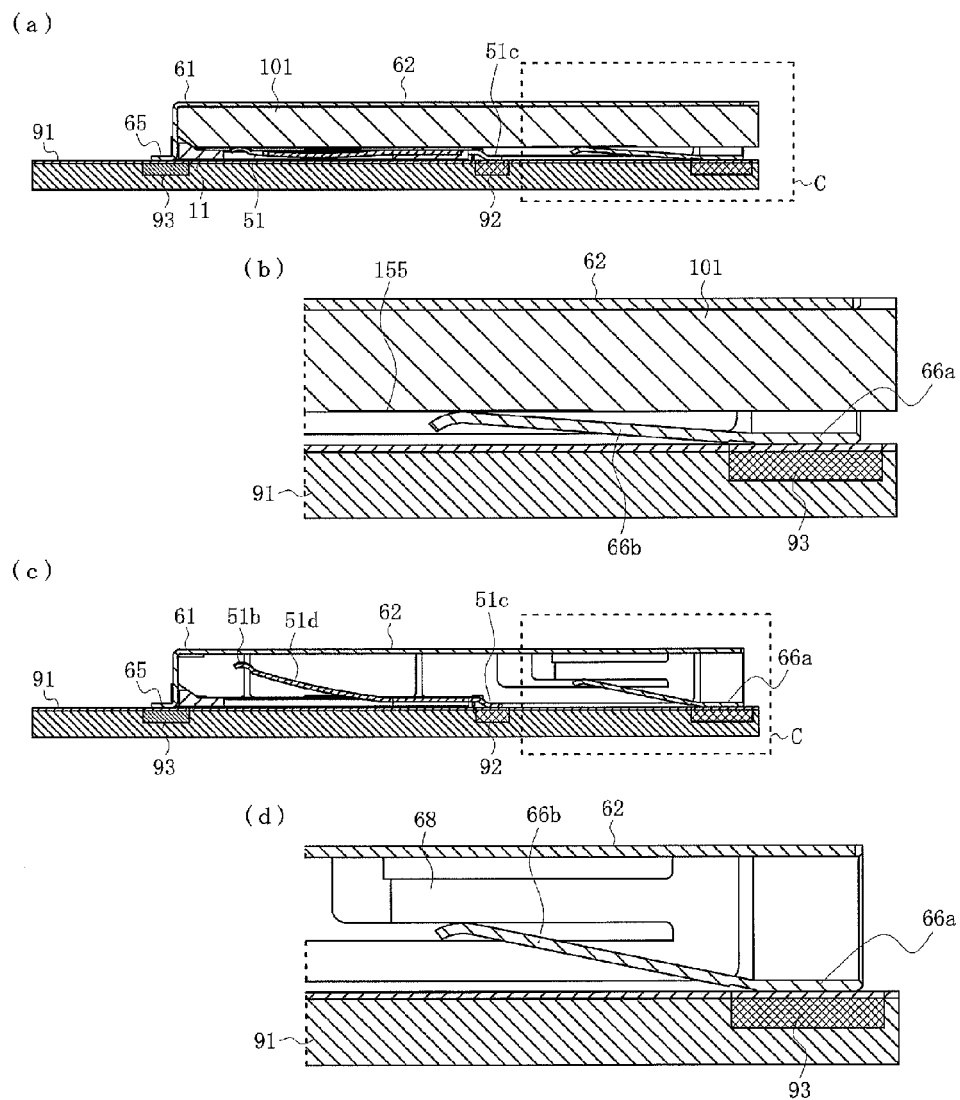
FIG. 8 is a is a cross-sectional view illustrating a state in which the card inserted into the card connector of FIG. 1 is locked, and is a cross-sectional view along Arrows X in FIG. 7, where (a) is a cross-sectional view along Arrows X, (b) is an enlarged view of the C part in (a) and (c) and (d) are views corresponding to (a) and (b) in a state in which the card is not inserted into the card connector.

With this state, the contact part 51b of the corresponding terminal 51 contacts each of the contact pads 151 of the card 101, as illustrated in FIG. 7, to be electrically connected. Further, nearly the entire top surface 111c of the card 101 is covered by the top panel part 62 of the shell 61, and nearly the entire surface of the side edges 112 of both the left and right sides of the card 101 either abuts or draws near the side panel parts 64 of both the left and right sides in the shell 61. Accordingly, the position of the card 101 within the card connector 1 is stabilized, and the electrical connection between the contact pad 151 and the terminal 51 can be stably maintained.

Further, a heat dissipation pad 155 is arranged on the bottom surface 111d, and a part that is about a half of the rear end 111b side of the card 101 is biased upward by the card retention tab 66. Further, contact pad 151 is arranged on the bottom surface 111d, and a part that is about a half of the front end 111a side of the card 101 is biased upward by the terminals 51, so nearly the entire top surface 111c of the card 101 is compressed in the top panel part 62 direction of the shell 61. Therefore, the position of the card 101 within the card connector 1 is further stabilized. Moreover, the function by the card retention tab 66 and the terminals 51 for biasing the card 101 can be easily understood by comparing FIGS. 8(a)-(b) that illustrate the state in which the insertion of the card 101 is completed into the card connector 1, with FIGS. 8(c)-(d) that illustrate the state in which the card 101 is not inserted into the card connector 1.

The front end 111a and the rear end 111b side of the card of 101 are compressed toward the top panel part 62 of the shell 61 by the near entirety of the top surface 111c of the card 101. Therefore, the heat generated by the card 101 is efficiently transferred to the top panel part 62 and further transferred to the ground wire through the anchoring tab 65 and the anchoring pad 93 and is efficiently dissipated. Moreover, the card 101 has a low dimensional accuracy and there is a possibility for inconsistencies to occur in the thickness of the card 101 (the space between the top surface 111c and the bottom surface 111d). However, the card retention tab 66 and the terminals 51 function as a leaf spring with a cantilever form to bias the card 101 upward. Therefore, if there is inconsistency in the thickness of the card 101, the near entirety of the top surface 111c of the card 101 security abuts or is adjacent to the top panel part 62 of the shell 61. Accordingly, the heat generated by the card 101 is efficiently transferred from the top surface 111c to the top panel part 62.

Similarly, if there are further inconsistencies in the thickness of the card 101, the card retention tab 66 and the tip of the supporting armed tab 66b is compressed to the heat dissipation pad 155 of the card 101, and the contact with the heat dissipation pad 155 is securely maintain. The heat generated by the card 101 is transferred from the heat dissipation pad 155 to the ground wire through the supporting arm tab 66b, the base part 66a, and the anchoring pad 93 and is efficiently dissipated. In addition, the locking ridged part 68b of the locking member 68 fits into and engages the recessed part 113 formed on the side edge 112 of the card 101. Therefore, the card 101 is securely locked and held within the card connector 1.

As illustrated in FIG. 6(d), the recessed part 113 is provided with a lock receiving part 113a that is a nearly orthogonal to the side edge 112, and the shape is nearly a rectangular shape when viewed from above. The lock receiving part 113a is a surface near the front end 111a in the recessed part 113, and an area opposing the locking part 68b1 in a state where the locking ridged part 68b fits into the recessed part 113. Therefore, if a shock, impact or the like is applied to the electronic device, or if an external force is applied to the card 101 in a direction to remove it from the card housing space by pulling the card 101 by mistake, the card 101 cannot move any farther in the opposite direction to the insertion direction because the lock receiving part 113a of the recessed part 113 is abut and locked in the locking part 68b1 of the locking ridge part 68b. Accordingly, this not only can prevent disconnection from the card connector 1 by coming out from the card housing space, but can also prevent the release of the contact state between the contact pad 151 and the terminals 51.

When the locking ridged part 68b is fit into the recessed part 113, the surfaces of the locking main body 68a and the operating part 68c are almost flush with the panel part 64 of the periphery in a similar manner to the initial state. Accordingly, the locking part 68b1 that is nearly orthogonal to the surfaces of the locking main body part 68a and the operating part 68c is nearly orthogonal to the side panel part 64. Meanwhile, the side edge 112 of the card 101 is nearly parallel to the side panel part 64 due to being guided by the side panel part 64. Accordingly, the lock receiving part 113a that is nearly orthogonal to the side edge 112 is nearly orthogonal to the side panel part 64. Thereby, the locking part 68b1 of the locking ridged part 68b and the lock receiving part 113a of the recessed part 113 are mutually parallel and at the same time nearly orthogonal to the side panel part 64. In other words, the locked state cannot be released due to the near orthogonal insertion direction.

Furthermore, because the locking ridged part 68b is placed farther rearward than the area where the locking main body 68a is connected to the side panel part 64 in regards to the proceeding direction of the card 101, the locking main body 68a is placed farther to the front side than the area where the locking main body 68a is connected to the side panel part 64 in regards to the opposite direction to the proceeding direction of the card 101. In other words, when the card 101 is pulled out from the card housing space, the locking ridged part 68b is placed near the leading side of the locking member 68 that is the leaf spring member with a cantilever form. Therefore, when an external force in the retraction direction is applied to the card 101, a force in the penetration direction into the recessed part 113 acts on the locking ridged part 68b. In short, a force that displaces to the left side acts on the locking ridged part 68b in FIG. 6(d). Therefore, the locking ridged part 68b is not displaced to the outer direction of the shell 61, so the locked state between the locking part 68b1 of the locking ridged part 68b and the lock receiving part 113a of the recessed part 113 is not released.

Moreover, the card 101 has a low dimensional accuracy, and there is a possibility for inconsistencies to occur in the position of the recessed part 113 in regards to the front and back directions of the card 101. In this case, when the locking ridged part 68b of the locking member 68 fits into the recessed part 113 in a locked state and an inconsistency occurs in the position of the card 101 within the card connector 1, as a result, an inconsistency also occurs in the position of the contact pad 151 and the heat dissipation pad 155 in regards to the insertion and removal direction of the card 101. However, as illustrated in FIG. 4(b), the contact pad 151 and the heat dissipation pad 155 are provided with a long and narrow shape in the front to back direction of the card 101, and therefore when an inconsistency occurs in the position of the card 101 within the card connector 1 in regards to the insertion and removal direction of the card 101, contact between the contact part 51b of the terminals 51 and the supporting arm tab 66b of the card retention tab 66 is securely maintained.

Further, when the card 101 is removed from the card connector 1, the operating part 68c is displaced in the outer direction of the shell 61 to release the locked state between the locking part 68b1 of the locking ridged part 68b and the lock receiving part 113a of the recessed part 113. Subsequently, the near rear end 111b of the card 101 can be held, and pulls out the card 101 from the card housing space while keeping the operating part 68c displaced to the outer direction of the shell 61. Accordingly, the card 101 can be removed easily and rapidly from the card connector 1.

In this manner, in the present embodiment, the shell 61 is provided with a top panel part 62, a plurality of side panel parts 64 installed from the side edge of the top panel part 62, anchoring tabs 65 the bottom end edge of the side panel part 64, and a card retention tab 65 as a heat transfer enhancing member connected to the bottom end edge of a side panel part 64. At least one of the anchoring tabs 65 is connected to the anchoring pad 93 arranged on a substrate 91. The card retention tab 66 upwardly biases the bottom surface 111d housed within the card housing space and compresses the top surface 111c to the top panel part 62 to enhance heat transfer from the card 101 to the anchoring pad 93 through the shell 61.

By so doing, the card connector 1 can have a small size and simple configuration, and yet can rapidly remove the heat generated by the card 101 by effectively transferring the heat through the shell 61 to the anchoring pad 93. Further, a highly reliable card connector 1 can be obtained with a few parts, easy manufacturing and low cost.

In addition, the card 101 is provided with the heat dissipation pad 155 arranged on the bottom surface 111d thereof, and the card retention tab 66 abuts the heat dissipation pad 155. Accordingly, the heat generated by the card 101 can be more rapidly removed by transferring also through the heat dissipation pad 155 and the card retention tab 66. Further, the card retention tab 66 is provided with a base part 66a connected to the anchoring pad 93, and a supporting arm tab 66b that extends from the base part 66a. The tip of the supporting arm tab 66 securely abuts the heat dissipation pad 155. Thereby, the heat generated by the card 101 can be more securely transferred and removed.

In addition, the contact pad 151 of the card 101 is arranged on the bottom surface 111d on the front end side half portion on the card and is upwardly biased by the terminals 51. The heat dissipation pad 155 is arranged on the bottom surface 111d on the rear end side half portion on the card 101 and is upwardly biased by the card retention tab 66. Thereby, because nearly the entirety of the top surface 111c of the card 101 is compressed towards the top panel part 62 of the shell 61, the disposition of the card 101 housed in the card housing space is stabilized, and the heat generated by the card 101 is efficiently transferred and removed from the top surface 111c to the top panel part 62.

Figure 9:
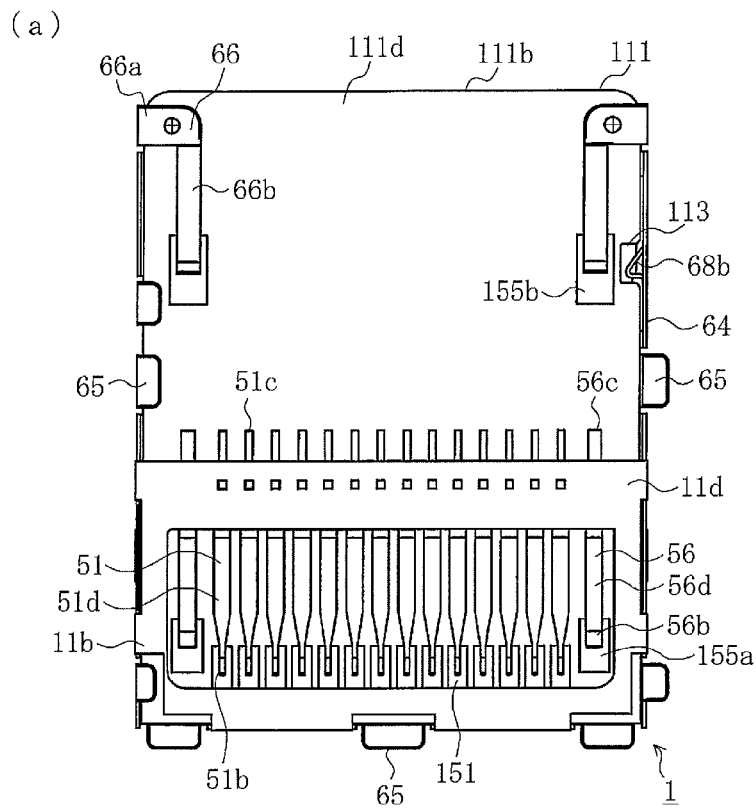
FIG. 9 is a drawing illustrating a card connector according to the second embodiment of the Present Disclosure, where (a) is a bottom view illustrating the state where an inserted card is locked, and (b) is a perspective view illustrating a state where the shell and card are removed.
Figure 9:
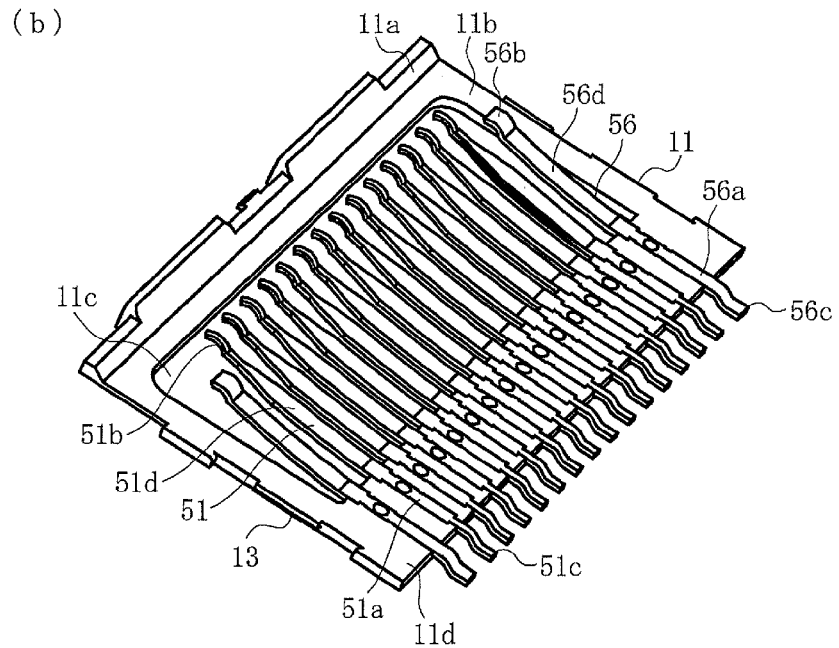
Figure 10:
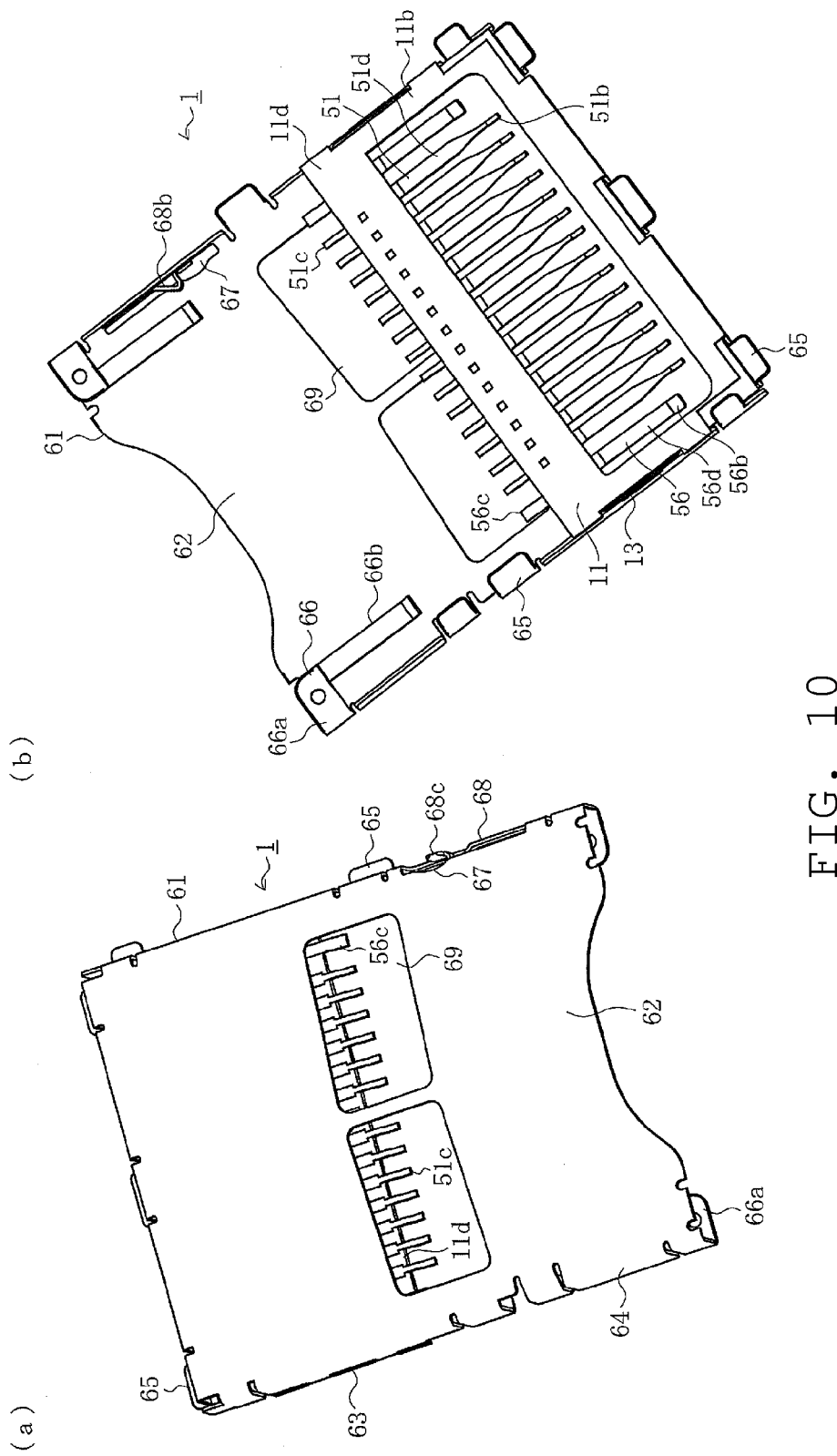
FIG. 10 is a drawing illustrating the card connector of FIG. 9, where (a) is a perspective view from above and (b) is a perspective view from below.
Figure 11:
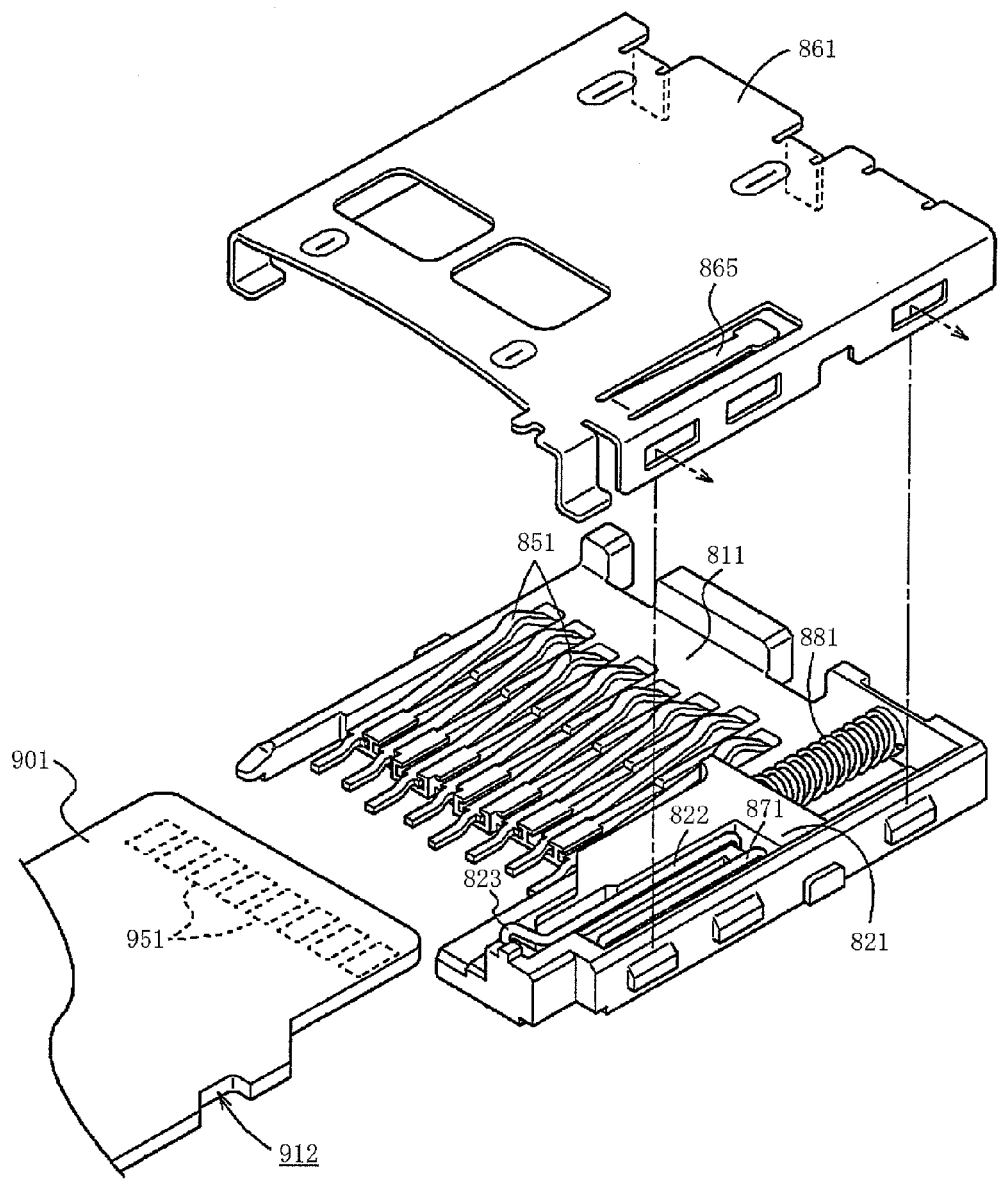
FIG. 11 is a view illustrating a conventional card connector.

FIGS. 9-10 illustrate a second embodiment of the Present Disclosure. This description will omit the explanation for those items with the same structure as the first embodiment but will give the same reference number. Further, regarding the same operation and effects as the first embodiment, such description will be also omitted.

In the present embodiment, the card 101 includes, as the heat dissipation pad 155 that is a heat dissipation member, a front side heat dissipation pad 155a as a second heat dissipation pad arranged on the front half portion (an area closer to the front end 111a than the center point between the front end 111a and the rear end 111b), and a rear side heat dissipation pad 155b as a first heat dissipation pad arranged on the rear half portion (an area closer to the rear end 111b than the center point between the front end 111a and the rear end 111b). Typically, the front side heat dissipation pads 155a and the rear side heat dissipation pads 155b are respectively each provided in pairs. Further, the front side heat dissipation pads 155a are arranged in positions on both outer sides of the rows of contact pads 151 arranged side-by-side in the width direction of the card 101, and the rear side heat dissipation pads 155b are arranged in similar positions as the positions of the heat dissipation pads 155 described in the first embodiment. Moreover, other points with respect to the front heat dissipation pads 155a and the rear side heat dissipation pads 155b are similar to the heat dissipation pads 155 described in the first embodiment, and thus the explanations thereof are omitted.

Further, in the present embodiment, the card connector 1 has card retention terminals 56 that function as a second heat transfer enhancing member. The card retention terminals 56, similar 77 to the terminals 51, are long and narrow band shaped members that extend in mutually parallel in the front-back direction, and include a main body part 56a extending in the front-back direction, an arm part 56d extending forward from the front end of the main body part 56a, a contact part 56b connecting to the tip of the arm part 56d, and a tail part 56c as the solder tail part extending forward from the rear end of the main body part 56a. Further, the card retention terminals 56 are respectively arranged at both outer sides of the rows of terminals 51 arranged side-by-side in the width direction of the housing 11.

In addition, the card retention terminals 56, similar to the terminals 51, may be integrated with the terminal retention part 11d by overmolding. However, terminal load grooves may be formed on the top side of the terminal retention part 11d so as to extend in the front-back direction, and the card retention terminals 56 may be inserted and attached into the terminal loading grooves.

Also, for the card retention terminals 51, the main body part 56a is attached to the terminal retention part 11d, and the arm part 56d extends diagonally upward towards the back wall part 11a, and the contact part 56b that is connected to the tip of the arm part 56d protrudes upward from the top surface of the bottom wall part 11b. The contact part 56b of each card retention terminal 56 contacts the front side heat dissipation pad 155a that corresponds to the bottom surface 111d of the card 101. The arm part 56d functions as the cantilever leaf spring member to bias the contact part 56b elastically upward.

Therefore, the contact part 56b is suppressed by the front side heat dissipation pad 155a of the card 101, so contact between the contact part 56b and the front side heat dissipation pad 155a is securely maintained.

Further, the tail part 56c protrudes towards the front side from the edge of the front side of the bottom wall part 11b, and is anchored and connected to a card retention terminal pad (not illustrated) formed on the surface of the substrate 91 or the like. The card retention terminal pad, similar to the anchoring at 93, is connected to the undersurface of the substrate 91 or to a ground wire or the like formed internally. As described above, the ground wire of substrate 91 is, for example, a plate-like member with a wide width made of metal with high heat conductivity, and it is preferable to be a member that functions as a heat radiating or conducting plate.

By so doing, the heat generated by the card 101 can be transferred to the ground wire through the front side heat dissipation pad 155a, the card retention terminal 56, and the card retention terminal pad to be efficiently dissipated. In this case, the card retention terminal pad functions as a heat transfer pad. In addition, the card retention terminal pad, similar to the anchoring pad 93, is not a ground wire that only serves as a heat radiator or heat conductor, but a ground line may be connected to a heat radiating plate or a heat conducting plate.

In this manner, the card connector 1 in the present embodiment has a card retention terminal 56 that functions as a second heat transfer enhancing member. Therefore, the heat generated by the card 101 can be transferred to the ground wire of the substrate 91 through the top panel part 62, side panel part 64, anchoring tab 65 and anchoring pad 93. In addition to being transferred to the ground wire of the substrate 91 through the rear side heat dissipation pad 155b, the card retention tab 66 and the anchoring pad 93, and further by being transferred to the ground wire through the front side heat dissipation pad 155a, the card retention terminals 56 and the card retention terminal pads, the heat generated by the card 101 can be removed extremely rapidly.

Moreover, as illustrated in FIG. 10, an observation window 69 can be formed, as necessary, as an opening part to the top panel part 60 to the shelf 61. The observation window 69 is an opening to visually confirm the soldering quality between, typically, the tail part 51c and the terminal connection pad 92, and the connected state between the tail part 51c of the terminal 51 and the terminal connection pad 92 formed on the surface of the substrate 91 in the operational process of attaching the card connector to the surface of the substrate 91. Therefore, the observation window 69 in the top panel part 62 is desirable to be formed in a position that corresponds to directly above the tail part 51c, but if enabling visual confirmation of the connected state between the tail part 51c and the terminal connection pad 92 through the observation window 69, the position is not required to be directly above the tail part 51 and may be formed in any position.

In addition, in the example illustrated in FIG. 10, two observation windows 69 are formed, however, the number of observation windows 69 can be one, or it can be three or more and can suitably change. Further, the shape of the observation window 69 also need not be rectangular as illustrated in FIG. 10 that can be suitably changed.

In addition, because the observation window 69 can become an obstacle to heat transfer from the top surface 111c of the card 101 through the top panel part 62, the area of the observation window 69 is preferred to be as small as possible, with zero being optimally desired from the perspective of rapid removal of the heat generated by the card 101.

In this manner, in the present embodiment, the heat dissipation pad 155 includes a front side heat dissipation pad 155a that is arranged on the bottom surface 111d of the front end 111a side half portion on the card 101, and the heat transfer enhancing member includes card retention terminals 56 that abut the front side heat dissipation pad 155a. Thereby, because the heat generated by the card 101 can be transferred and removed also through the front side heat dissipation pad 155a end to the card retention terminals 56, the heat generated by the card 101 can be removed extremely rapidly.

Further, the card retention terminals 56 are provided with a main body part 56a attached to the housing number 11, an arm part 56d that extends from the front end of the main body part 56a, a connection part 56b that is connected to the tip of the arm part 56d, and a tail part 56c that extends from the rear end of the main body part 56a. The connection part 56b abuts the front and heat dissipation pad 155a, and the tail part 56c is connected to the card retention terminal pad. Accordingly, the card retention terminals 56, created in the same manner as the terminals 51, can attached to the housing 11 in the same manner as the terminals 51, and adding card retention terminals 56 can be done without increasing the cost of the card connector 1.

While a preferred embodiment of the Present Disclosure is shown and described, it is envisioned that those skilled in the art may devise various modifications without departing from the spirit and scope of the foregoing Description and the appended Claims.

What is claimed is:

1. A card connector, the card connector comprising:
  a housing for housing a card, the housing including a terminal member;
  a connecting terminal, the connecting terminal being attached to the housing, the connecting terminal being connected to the terminal member;
  a cover member, the cover member being connected to the housing and attached to a substrate, the cover member forming a card housing space between the housing, the cover member including a top panel part, a plurality of side panel parts and at least one anchoring tab, each side panel part disposed on an edge of the top panel part, each anchoring tab extending from a bottom edge of one of the side panel parts and connected to a pad being disposed on the substrate; and
  first and second heat transfer enhancing members, the first heat transfer enhancing member extending from the cover member from the bottom edge of the side part and the second heat transfer member extending along the housing, the second heat transfer enhancing member including a main body portion attached to the housing, an arm portion extending from a front end of the main body portion, a tail portion extending from a rear end of the main body portion and a connecting portion that connects to a tip end of the arm portion.

2. The card connector of claim 1, wherein the first heat transfer enhancing member upwardly biases a lower surface of a card, and heat transfer is enhanced to the pad through the cover member from the card by pressing a top surface of the card on the top panel part.

3. The card connector of claim 2, wherein the card includes a heat dissipation pad, the heat dissipation pad being arranged on the lower surface thereof.

4. The card connector of claim 3, wherein the first heat transfer enhancing member connects to the heat dissipation pad.

5. The card connector of claim 4, wherein the first heat transfer enhancing member includes a base part, the base part being connected to the heat dissipation pad.

6. The card connector of claim 5, wherein a supporting arm tab extends from the base part, and a tip end of the supporting arm tab abuts the heat dissipation pad.

7. The card connector of claim 6, wherein the terminal member is disposed on the lower surface on a front end side half portion on the card, and is upwardly biased by the connecting terminal.

8. The card connector of claim 7, wherein the heat dissipation pad is disposed on the lower surface on a rear end side half portion on the card, and is upwardly biased by the first heat transfer enhancing member.

9. The card connector of claim 8, wherein the card further includes a second heat dissipation pad, the second heat dissipation pad being disposed on the lower surface of the front end side half portion on the card.

10. The card connector of claim 9, wherein the connecting portion of the second heat transfer enhancing member abuts the second heat dissipation pad, and the tail portion is connected to the second heat dissipation pad.

11. A card connector, the card connector comprising:
  a housing for housing a card, the housing supporting a plurality of card-contacting terminals widthwise of the housing, the card-contacting terminals being conductive;
  a cover member, the cover member being conductive, the cover member being connected to the housing and configured for attachment to a substrate, the cover member and the housing spaced apart from each other to define a card-receiving space of the card connector, the cover member including a top panel, a plurality of side panels, and tail portions, the plurality of side panels extending around edges of the top panel, the tail portions extending from bottom edges of the side panels, the tail portions being configured for attachment to conductive pads disposed on a surface of the substrate; and
  first and second heat transfer enhancing members for contacting respective first and second heat dissipation pads on a card inserted into the card-receiving space, the first heat transfer enhancing member extending longitudinally from the cover member and spaced apart from the top panel of the cover member, the second heat transfer member extending longitudinally along the housing and spaced apart from the cover member, the second heat transfer enhancing member including a main body portion, respective arm and tail portions, and a connecting portion, the main body portion being attached to the housing, the arm and tail portions disposed at opposite ends of the main body portion, the arm and tail portions being connected together by the connecting portion.

12. The card connector of claim 11, wherein the first heat transfer enhancing member has a U-shaped configuration when viewed from above, and the second heat transfer enhancing member has a linear configuration within the card-receiving space.

13. The card connector of claim 11, wherein the first and second heat transfer enhancing members are spaced longitudinally apart from each other.

14. The card connector of claim 13, wherein the first and second heat transfer enhancing members are spaced apart from each other widthwise.

15. The card connector of claim 11, further including a pair of first heat transfer enhancing members and a pair of second heat transfer enhancing members, the first and second heat transfer enhancing members of each pair being spaced widthwise apart from each other and the pair of first heat transfer enhancing members being spaced apart longitudinally from the pair of second heat transfer enhancing members.

* * * * *